(12) United States Patent
Sunohara et al.

(10) Patent No.: US 8,111,523 B2
(45) Date of Patent: Feb. 7, 2012

(54) WIRING BOARD WITH SWITCHING FUNCTION AND METHOD OF MANUFACTURING THE SAME

(75) Inventors: Masahiro Sunohara, Nagano (JP); Kei Murayama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 136 days.

(21) Appl. No.: 12/360,443

(22) Filed: Jan. 27, 2009

(65) Prior Publication Data

US 2009/0196001 A1 Aug. 6, 2009

(30) Foreign Application Priority Data

Jan. 31, 2008 (JP) ................................. 2008-20598

(51) Int. Cl.
*H05K 7/00* (2006.01)

(52) U.S. Cl. ........ 361/781; 361/801; 257/619; 257/632; 257/758; 320/134; 320/136; 337/36; 337/102; 337/107; 337/131; 337/365; 219/507

(58) Field of Classification Search .................. 361/781, 361/801; 337/36, 66, 102, 131, 365, 380, 337/107, 141; 257/619, 758, 632; 320/134, 320/136; 219/507
See application file for complete search history.

(56) References Cited

U.S. PATENT DOCUMENTS

| | | | | |
|---|---|---|---|---|
| 3,617,971 A | * | 11/1971 | Ellenberger | 337/66 |
| 4,136,323 A | * | 1/1979 | D'Entremont et al. | 337/107 |
| 4,434,414 A | * | 2/1984 | Bell et al. | 337/102 |
| 4,490,704 A | * | 12/1984 | Snider et al. | 337/372 |
| 4,847,587 A | * | 7/1989 | Muller | 338/215 |
| 4,862,132 A | * | 8/1989 | Hollweck | 337/102 |
| 5,144,273 A | * | 9/1992 | Hayden | 337/380 |
| 5,182,538 A | * | 1/1993 | Muller | 337/102 |
| 5,428,336 A | * | 6/1995 | Smith et al. | 337/365 |
| 5,454,230 A | * | 10/1995 | Janke et al. | 62/126 |
| 5,781,097 A | * | 7/1998 | Givler | 337/367 |
| 5,923,520 A | * | 7/1999 | Ikeda et al. | 361/150 |
| 6,133,817 A | * | 10/2000 | Hofsass et al. | 337/377 |
| 6,271,740 B1 | * | 8/2001 | Chikamatsu | 335/151 |
| 6,294,977 B1 | * | 9/2001 | Kalapodis et al. | 337/140 |
| 6,300,860 B1 | * | 10/2001 | Hofsass | 337/377 |
| 6,342,826 B1 | * | 1/2002 | Quinn et al. | 337/300 |
| 6,410,360 B1 | * | 6/2002 | Steenberge | 438/52 |
| 6,414,285 B1 | * | 7/2002 | Takeda | 219/507 |
| 6,756,876 B2 | * | 6/2004 | Sullivan et al. | 337/111 |

(Continued)

FOREIGN PATENT DOCUMENTS

JP 7-26824 6/1995

*Primary Examiner* — Xiaoliang Chen

(74) *Attorney, Agent, or Firm* — Kratz, Quintos & Hanson, LLP

(57) ABSTRACT

A wiring board for use in mounting an electronic component includes a switch element portion interposed in a signal transmission line including a wiring layer linked to an electrode terminal of the electronic component. The switch element portion has such a structure as to change the shape thereof depending on a temperature, and to disconnect the signal transmission line when the temperature exceeds a predetermined temperature. A conductor layer which constitutes a portion of the signal transmission line is formed at the bottom of a cavity formed in an electronic component mounting surface side of the wiring board. One end of the switch element portion is fixedly connected to the wiring layer, and another end thereof is in contact with the conductor layer when the temperature is equal to or lower than the predetermined temperature.

6 Claims, 6 Drawing Sheets

30: WIRING BOARD WITH SWITCHING FUNCTION

U.S. PATENT DOCUMENTS

| | | | |
|---|---|---|---|
| 7,582,969 B2* | 9/2009 | Carlson et al. | 257/758 |
| 7,659,805 B2* | 2/2010 | Takeda | 337/365 |
| 2001/0010488 A1* | 8/2001 | Minners | 337/131 |
| 2004/0022044 A1* | 2/2004 | Yasuoka et al. | 361/801 |
| 2004/0189245 A1* | 9/2004 | Teraoka et al. | 320/107 |
| 2005/0236935 A1* | 10/2005 | Ohmori et al. | 310/328 |
| 2006/0246630 A1* | 11/2006 | Sunohara et al. | 438/125 |
| 2007/0045781 A1* | 3/2007 | Carlson et al. | 257/632 |
| 2008/0079120 A1* | 4/2008 | Foster et al. | 257/619 |
| 2008/0116851 A1* | 5/2008 | Mori | 320/134 |

* cited by examiner

STATE AT BELOW PREDETERMINED TEMP.
(INCLUSIVE OF NORMAL TEMP. STATE)

STATE AT ABOVE PREDETERMINED TEMP.

WIRING BOARD WITH SWITCHING FUNCTION AND METHOD OF MANUFACTURING THE SAME

CROSS-REFERENCE TO RELATED APPLICATIONS

This application is based on and claims priority of Japanese Patent Application No. 2008-20598 filed on Jan. 31, 2008, the entire contents of which are incorporated herein by reference.

BACKGROUND OF THE INVENTION (a) Field of the Invention

The present invention relates to a wiring board (hereinafter also referred to as "semiconductor package") for use in mounting an electronic component such as a semiconductor element. More particularly, it relates to a wiring board with switching function through which a signal communication is carried out between an electronic component mounted thereon and a motherboard (or a packaging board) such as a printed wiring board, and which is adapted to avoid a disadvantage which can possibly arise in the event of overheating of the electronic component, and relates to a method of manufacturing the same.

The wiring board with switching function according to the present invention is preferably applicable particularly in mounting electronic components which emit a large amount of heat, such as MPUs (microprocessor units), light emitting elements including LEDs (light emitting diodes), or the like, which are high in power consumption.

(b) Description of the Related Art

Generally, manufacturing of a semiconductor package such as BGA (ball grid array), LGA (land grid array) or PGA (pin grid array) involves preparing a core substrate used as a base material for the package; forming on both surfaces of the core substrate, a multilayer wiring structure, for example, by sequentially repeating a formation of a conductive pattern (a wiring layer), a formation of an insulating layer, and a formation of a via hole in the insulating layer; coating the outermost wiring layer with a protection film; and forming an opening at a desired position in the protection film to thereby expose a portion of the conductive pattern (i.e., a pad portion). Furthermore, in the case of BGA or PGA, a ball, a pin or the like serving as an external connection terminal is bonded to the exposed pad portion. Such a semiconductor package is configured to mount an electronic component (or a chip) such as a semiconductor element on one surface, and to be packaged on a motherboard such as a printed wiring board via the external connection terminal provided on the other surface. In other words, the chip and the motherboard are electrically connected with the semiconductor package interposed therebetween.

Thus, the semiconductor package is intended mainly to enlarge the pad pitch of the chip to that of the motherboard by rewiring between an electrode terminal of the chip mounted on the package and the external connection terminal (or the terminal for motherboard connection) of the package. In this respect, the semiconductor package is functionally the same as an interposer. Thus, the conventional semiconductor package basically functions as a medium for signal communication between the chip and the motherboard.

On the other hand, there is a semiconductor package which includes a package substrate having a function corresponding to a passive element (typically, a capacitance element) embedded therein. As a semiconductor chip or the like mounted on a recent package becomes more multifunctional, wirings routed in a package substrate become accordingly higher in density, and thus, wiring patterns are in closer proximity to each other, and a wiring length also becomes longer. The wiring patterns in close proximity to each other may cause a crosstalk noise or the like, and a long length of wiring may cause an increase in inductance and lead to a signal delay. As a result, a disadvantage such as a decrease in the processing speed of the electronic component mounted on the package, can possibly occur. In order to eliminate such a disadvantage, a capacitor function for achieving a desired decoupling effect is embedded in the substrate.

As can be seen with respect to the conventional semiconductor package, only the package including the passive element which achieves a specific effect besides the signal communication medium function, has been put into practical use, and no other special function has been included in the package. Thus, a function corresponding to a switch element, a filter element, or the like, is generally mounted on the motherboard as an external component.

An example of technology related to the above-mentioned art is disclosed in Japanese examined Utility Model Publication (JUMP) (Kokoku) 7-26824. This publication discloses a hybrid integration device having a switching element. The device includes a double-sided printed wiring board having a control element mounted on one surface and metal foil remaining on the other surface, and a metal-base printed wiring board having a switching element mounted on one surface. In this configuration, the printed wiring boards are disposed face to face so that the elements mounted on the wiring boards face each other, and a terminal portion having a ring-shaped saturable inductance element is provided at one end of a gap formed by the printed wiring boards facing each other. Further, the other end of the gap is covered with a metal plate, and a connection lead is drawn out through the ring-shaped saturable inductance element.

As mentioned above, with respect to the conventional semiconductor package (or wiring substrate), only the package including the passive element which achieves a specific effect besides the signal communication medium function has been put into practical use. Thus, a function corresponding to a switch element, a filter element or the like, is generally mounted on the motherboard as an external component. This leads to an increase in the number of components on the motherboard, which in turn, causes a problem in that the area occupied by the external components increases the size and cost of the semiconductor package.

On the other hand, when an electronic component high in power consumption (or large in the amount of heat emitted), such as MPU, is mounted, overheating may possibly occur during operation of the component and thus cause malfunction, thermal runaway or the like. In this case, provision of a function corresponding to a fuse or the like for preventing such a trouble with the package would be effective.

SUMMARY OF THE INVENTION

An object of the present invention is to provide a wiring board with switching function and a method of manufacturing the same, which are capable of avoiding a disadvantage which can possibly arise due to an increase in the temperature of an electronic component mounted on the wiring board, and also capable of reducing the number of external components and hence contributing to miniaturization and cost reduction of a packaging board.

According to one aspect of the invention, there is provided a wiring board with switching function for use in mounting an electronic component, including a switch element portion interposed in a signal transmission line including a wiring layer linked to an electrode terminal of the electronic component. In the wiring board, the switch element portion has such a structure as to change the shape thereof depending on a temperature, and to disconnect the signal transmission line when the temperature exceeds a predetermined temperature.

According to the configuration of the wiring board with switching function of the present invention, the switch element portion is interposed in a signal transmission line including a wiring layer linked to an electrode terminal of the electronic component mounted on the wiring board. Therefore, even if overheating occurs during the operation when an electronic component high in power consumption, such as an MPU, is mounted on the wiring board, the signal transmission line is automatically cut off by the switching function of the switch element portion when the temperature of the wiring board exceeds a predetermined temperature. Namely, the switch element portion serves as a kind of fuse. This enables preventing occurrence of malfunction, thermal runaway or the like of the electronic component caused by the increase in the temperature. This contributes to a long life of the electronic component.

Also, the switching function can be provided in the package (the wiring board), and thus, for such an application in which a switching component is provided on the motherboard (the packaging board) mounted with the package, the number of external components provided on the motherboard can be reduced. This contributes to miniaturization and cost reduction of motherboard (packaging board).

According to another aspect of the invention, there is provided a method of manufacturing a wiring board with switching function, including a process of building a switch element portion into the wiring board, the process including: forming a cavity in one surface of a base substrate of the wiring board; forming in the cavity a through hole piercing through the base substrate in a thickness direction thereof; forming an insulating layer over an entire surface of the base substrate, the entire surface including inner wall surfaces of the cavity and the through hole; filling only the through hole portion with a conductive material; forming a sacrificial layer to fill the cavity therewith; forming a first conductor layer on the sacrificial layer and on the insulating layer linked thereto at a temperature higher than the normal temperature, the first conductor constituting a portion of the switch element portion; forming a second conductor layer on the first conductor layer at a temperature higher than the normal temperature, the second conductor layer being made of a material having a lower coefficient of thermal expansion than a material constituting the first conductor layer; and removing the sacrificial layer at the normal temperature.

With reference to the following embodiment of the present invention, descriptions is given for features in the other configurations or processes of the wiring board with switching function and the method of manufacturing the same according to the present invention, as well as for characteristic advantages based on the features thereof, and so on.

DESCRIPTION OF THE PREFERRED EMBODIMENTS

Description is given below with regard to preferred embodiments of the present invention with reference to the accompanying drawings.

Figure 1:
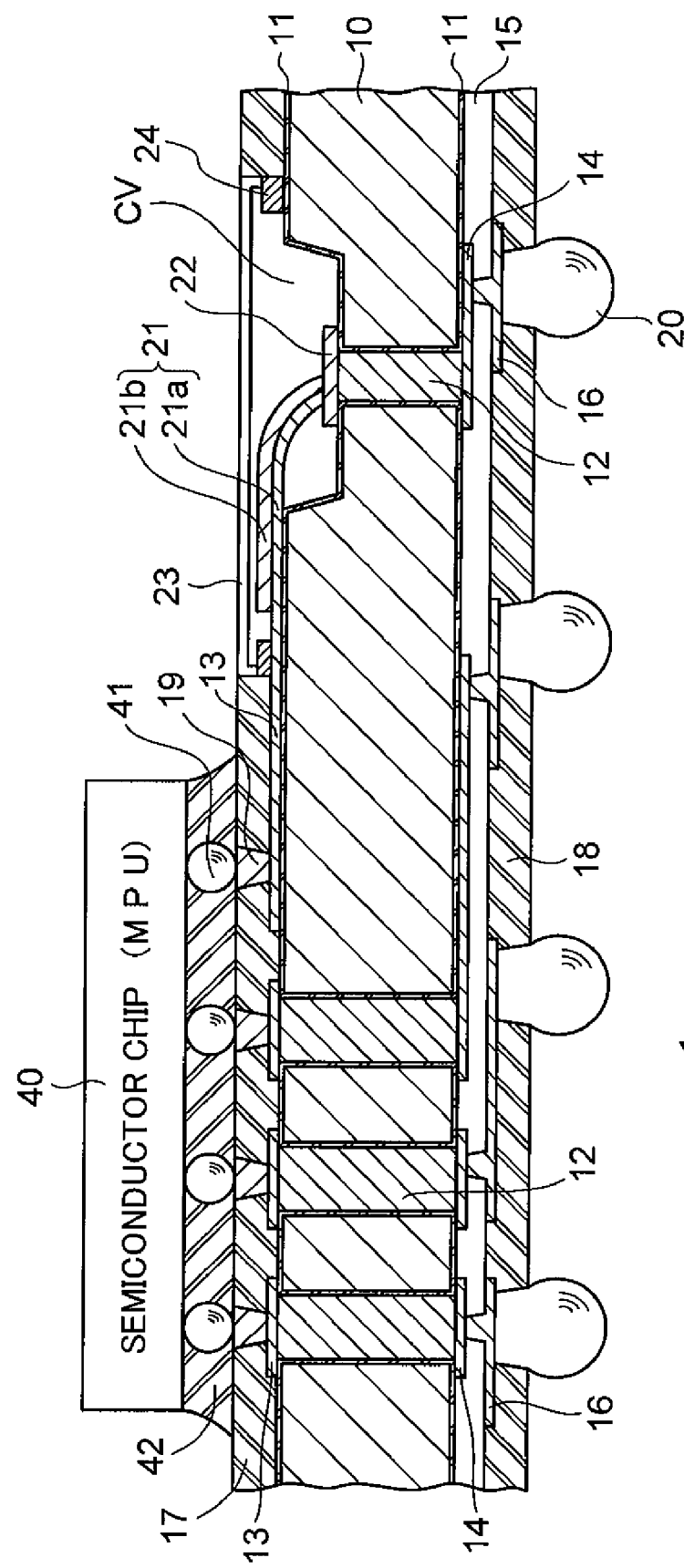
FIG. 1 is a sectional view showing the configuration of a wiring board with switching function according to an embodiment of the present invention.

FIG. 1 shows in sectional view the configuration of a wiring board 30 with switching function according to one embodiment of the present invention. As shown in the illustrated example, an MPU (a semiconductor chip) 40 as an electronic component is mounted on the surface of the wiring board 30 with switching function of the embodiment via an electrode terminal (e.g., a solder bump or the like) 41 thereof. Also, an underfill resin 42 is filled into a gap between the chip 40 and the wiring board 30, thereby fixing the chip 40 and electrically insulating the electrode terminal 41 from the outside.

The MPU is an element relatively high in power consumption (or large in the amount of heat emitted), and can possibly emit heat higher than a given operating temperature, depending on the ambient temperature. Accordingly, the MPU has a protecting circuit embedded therein, for preventing malfunctioning, thermal runaway or the like which may occur during emission of the heat. The present embodiment assumes that the MPU 40 having such a protecting circuit embedded therein is mounted on the wiring board. The protecting circuit within the MPU 40 is actuated based on a switching function packaged on the wiring board 30 as is described later.

As shown in FIG. 1, the wiring board 30 with switching function according to the embodiment includes a silicon substrate 10 used as a base substrate for the wiring board; an insulating layer 11 formed on the silicon substrate surface including the inner wall surface of a through hole formed at a desired position in the silicon substrate 10; a conductor (or a through-hole electrode) 12 filled in the through hole; wiring layers 13 and 14 formed in desired pattern layouts on the both surfaces of the silicon substrate 10 with the insulating layer 11 interposed therebetween; an insulating layer 15 formed to coat the wiring layer 14 on the side opposite to the chip mounting surface side, and having via holes reaching respective pad portions of the wiring layer 14 at desired positions; a wiring layer 16 formed in a desired pattern layout on the insulating layer 15 so as to fill the via holes; and insulating layers 17 and 18 as protection films formed to coat the both surfaces of the wiring board 30 other than pad portions defined at desired positions on the wiring layers 13 and 16, respectively. Copper (Cu) is used as a material for the through-hole electrodes 12 and the wiring layers 13, 14 and 16; an epoxy resin is used as a material for the insulating layer 15; and a solder resist is used as a material for the outermost insulating layers 17 and 18. The insulating layer 11 is made of a silicon oxide film ($SiO_2$) formed on the surface of silicon (Si) by thermal oxidation method or the like as is described later.

Also, it is desirable that the pad portions (Cu) be plated with nickel (Ni) and gold (Au) in this order, since external connection terminals (i.e., the electrode terminals 41 of the chip 40 mounted on the wiring board 30, and solder balls, pins or the like used for mounting the wiring board 30 on a motherboard such as a printed wiring board) are bonded to the pad portions of the wiring layers 13 and 16, which are exposed from the outermost insulating layers 17 and 18, respectively. This is for the purpose of improving contact bonding properties when the external connection terminals are bonded to the pad portions, and for the purpose of enhancing adhesion between the Au layer and the Cu layer constituting the pad portions and thereby preventing Cu from diffusing into the Au layer. In the embodiment, as shown in FIG. 1, the pad portion (the wiring layer 13) on the chip mounting surface side has a solder 19 deposited thereon by presoldering or the like, so that it can be easily connected to the electrode terminal 41 of the chip 40 when mounting the chip 40. In addition, the pad portion (the wiring layer 16) exposed from the insulating layer 18 on the side opposite to the chip mounting surface side is provided with a solder ball (or bump) 20 which is bonded thereto and used as an external connection terminal when mounting the wiring board 30 on a motherboard such as a printed wiring board. Note, it is to be understood that the provision of such an external connection terminal is not necessarily required, and the pad portion may remain exposed so that the external connection terminal can be bonded to the pad portion when needed. In that case, the surface of the pad portion is processed by Ni and Au plating or other surface-treatment.

Further, there is provided a switch element portion 21 which characterizes the present invention, at a desired position on the chip mounting surface side. The switch element portion 21 has a stacked structure of conductor layers 21a and 21b made of metals having different coefficients of thermal expansion, which form a "bimetal." One end of the switch element portion 21 (the end close to the side on which the chip 40 is mounted, in the illustrated example) is fixedly linked via the lower conductor layer 21a to the wiring layer 13 electrically connected to a given terminal (the rightmost terminal 41 in the illustrated example) of the chip 40. As mentioned above, the chip (MPU) 40 has embedded therein a circuit for preventing the malfunctioning, thermal runaway or the like caused by the rise in the temperature, and the circuit is linked to the wiring layer 13 via the given terminal 41.

Also, the other end of the switch element portion 21 is a free end, which extends from the upper end portion of a cavity CV formed to a predetermined depth as shown in FIG. 1 into the cavity, is further curved and is in contact with a conductor layer (pad portion) 22 formed at the bottom of the cavity CV. This contact state is released when the temperature of the switch element portion 21 exceeds a predetermined temperature, as is described later.

The switch element portion 21 is sealed, for example, with a cap 23 made of transparent glass or the like for protection from the outside. More specifically, the sealing of the switch element portion 21 is accomplished by applying a ring-shaped coating of an adhesive 24 to the insulating layer 11 (partially, to the wiring layer 13) around an area in which the switch element portion 21 is formed (namely, the cavity CV and its peripheral region), and by bonding the glass cap 23 formed to the size of the area via the adhesive 24. Incidentally, the height of the cap 23 is adjusted so as to be at the same height as the surface of the protection film 17 when the switch element portion 21 is sealed.

Figure 2A:
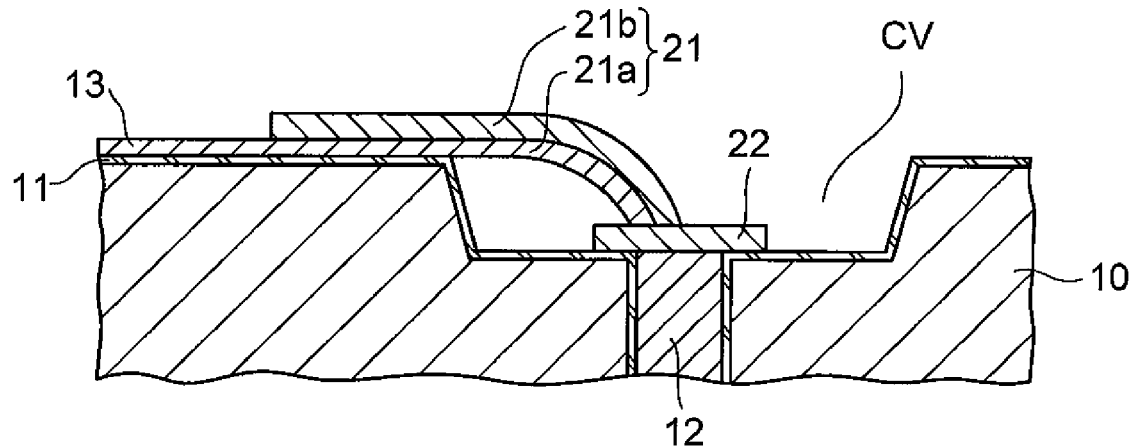
FIGS. 2A and 2B are views for explaining the function of a switch element portion of the wiring board shown in FIG. 1, FIG. 2A indicating an "on" state thereof, FIG. 2B indicating an "off" state thereof.
Figure 2B:
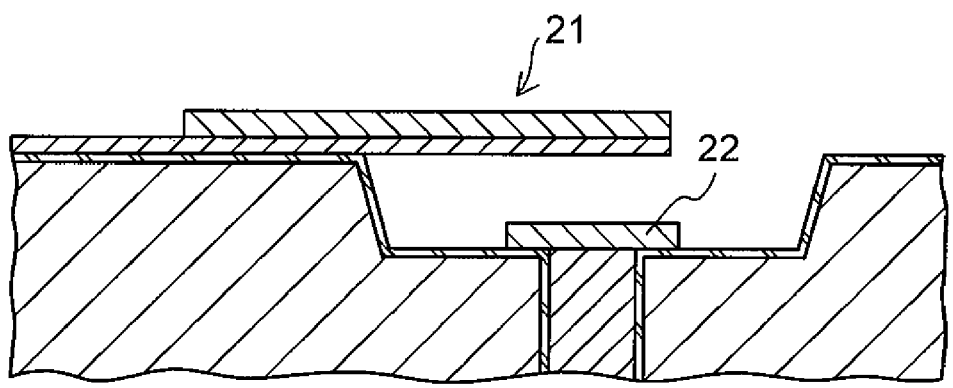

In the embodiment, metallic materials are selected so that the relationship between the coefficients of thermal expansion of the metals constituting the switch element portion (or the bimetal) 21 is as follows: (the metal of the lower layer: the conductor layer 21a)>(the metal of the upper layer: the conductor layer 21b). By the selection, the bimetal function allows the switch element portion 21 to exhibit "on" state or "off" state. FIGS. 2A and 2B show how the switch element portion 21 thus selected operates, and the switch element portion 21 is in the "on" state when curved (FIG. 2A), while the switch element portion 21 is in the "off" state when stretched straight (FIG. 2B). In other words, the switch element portion 21, at or below a predetermined temperature (inclusive of normal temperature state), is curved at the free end in the cavity CV to come into contact with the pad portion 22 and thereby assume the "on" state, while the switch element portion 21, above the predetermined temperature, is detached at the free end from the pad portion 22 to thereby assume the "off" state.

In order to ensure the on/off state of the switch element portion 21, a specific relationship is set among the dimensions (such as thicknesses or widths) of the switch element portion 21 and its related portions, the materials thereof, and the above-mentioned predetermined temperature. For example, assume that copper (having a coefficient of thermal expansion of about 17 ppm per degree) is used as the metal of the lower layer (i.e., the conductor layer 21a) and nickel (having a coefficient of thermal expansion of about 12 ppm per degree) is used as the metal of the upper layer (i.e., the conductor layer 21b), so as to form the switch element portion 21. In this case, the thickness of the lower conductor layer (Cu layer) 21a is selected to about 5 µm; the thickness of the upper conductor layer (Ni layer) 21b is selected to about 10 µm; the depth of the cavity CV is selected to about 50 µm; the size of the pad portion 22 formed at the bottom of the cavity CV is selected to about 100 µm; the thickness of the pad portion 22 is selected to about 10 µm; and the diameter of the through-hole electrode 12 formed immediately under the cavity CV is selected to about 50 µm. It has proved that, where the switch element portion 21 is configured under the conditions, the switch element portion 21 maintains the "on" state (FIG. 2A) when the temperature of the switch element portion 21 lies between about −30 and 200° C. (inclusive of normal temperature state (around 23° C.)), while the switch element portion 21 assumes the "off" state (FIG. 2B) when the temperature thereof exceeds 200° C.

The wiring board 30 according to the embodiment is characterized in that, as shown in FIG. 1 and FIGS. 2A and 2B, the switch element portion 21 is formed at a desired position on the chip mounting surface side so as to ensure the "on" operation and the "off" operation by setting the predetermined temperature (e.g., 200° C.) as a threshold value. Specific description for the materials for structural members which form the wiring board 30 of the embodiment, the sizes thereof, and the like, is given in connection with the following process.

Description is given below with regard to a method of manufacturing the wiring board 30 with switching function according to the embodiment with reference to FIGS. 3A to 3D, FIGS. 4A to 4C and FIGS. 5A to 5C showing manufacturing steps in order. Incidentally, in the illustrated example, there is shown only the configuration of the portions related to the present invention (i.e., the switch element portion 21 and its peripheral portion) for the sake of simplicity of illustration.

First, in the first step (FIG. 3A), a silicon wafer having a diameter of 8 inches and a thickness of about 725 µm is prepared and is thinned to a thickness of about 200 µm (to form the silicon substrate 10). For example, chemical polishing, chemical mechanical polishing (CMP), plasma etching or the like, may be used for the thinning process.

In the next step (FIG. 3B), the cavity CV is formed in the chip mounting surface side of the thinned silicon substrate 10. The cavity CV can be formed, for example, in the following manner.

First, an etching resist is formed on one surface of the silicon substrate 10 (on the upper side thereof in the illustrated example), using a patterning material, and an opening is formed at a desired position thereof (namely, a resist layer having the opening is formed). The opening of the resist layer is patterned in accordance with the shape of the cavity CV to be formed. A photosensitive dry film or a liquid photoresist (e.g., a liquid resist such as a novolak-base resin or an epoxy-base resin) can be used as the patterning material.

For example, where the dry film is used, the formation of the resist layer involves: first cleaning the surface of the silicon substrate 10; then laminating the dry film onto the surface by thermo-compression bonding; curing the dry film by subjecting the dry film to exposure by ultraviolet (UV) irradiation, using a mask (unillustrated) formed in a desired layout by patterning; and further etching away a target portion, using a predetermined developing solution (e.g., an organic-solvent-containing developing solution for a negative resist or an alkali-base developing solution for a positive resist) (i.e., forming the opening), thereby forming the resist layer according to the desired pattern layout. Where the liquid resist is used, the resist layer can be likewise formed in the desired pattern layout through the steps of: surface cleaning; resist coating on the surface; drying; exposure; and development.

Then, the cavity CV is formed by etching, with the patterned resist layer used as a mask, a portion of the silicon substrate 10 exposed from the opening of the resist layer, to a depth of about 50 μm, by a dry etching process such as reactive ion etching (RIE). Although an $SF_6/O_2$ base gas or a $CF_4/O_2$ base gas can be used for the RIE, the former (i.e., the $SF_6/O_2$ base gas) is preferable in that the etching rate of the former is higher than that of the latter. Instead of the RIE, wet etching using a solution of potassium hydroxide (KOH) or the like, may be used to form the cavity CV.

Figure 3A:
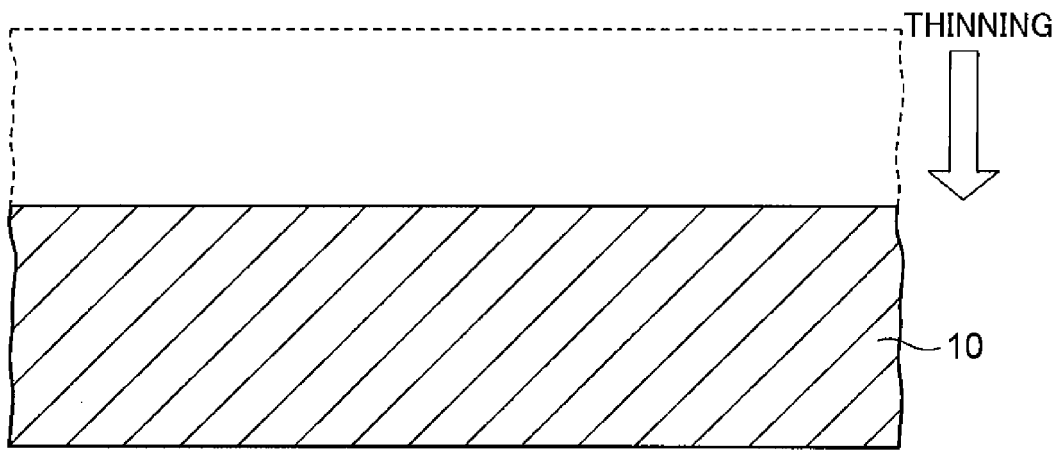
FIGS. 3A to 3D are sectional views showing steps of a method of manufacturing the principal portion (the switch element portion and its peripheral portion) of the wiring board shown in FIG. 1.
Figure 3B:
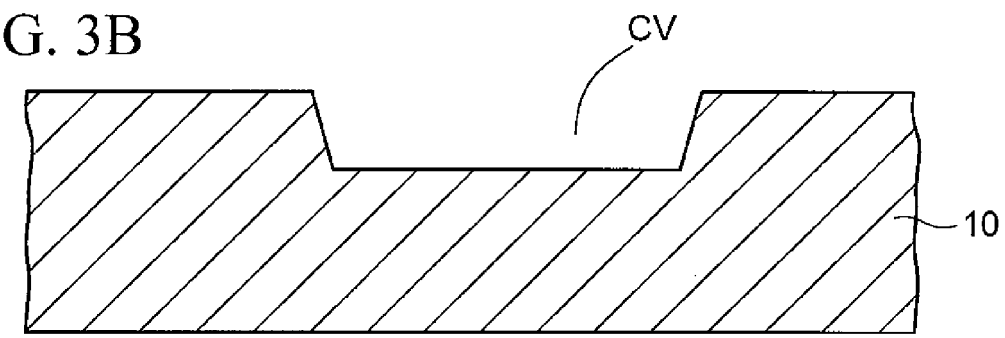

After that, the resist layer used as the etching resist is removed. For example, where the dry film is used as the etching resist, an alkaline chemical liquid such as sodium hydroxide or a monoethanolamine-base liquid can be used for the removal. Where the liquid resist such as the novolak-base resin or the epoxy-base resin is used as the etching resist, acetone, alcohol or the like can be used for the removal. Thereby, fabricated is the silicon substrate 10 having the cavity CV formed to a desired depth in the one surface thereof, as shown in FIG. 3B.

In the next step (FIG. 3C), a through hole TH is formed in the cavity CV formed in the silicon substrate 10. The through hole TH can be formed, for example, in the following manner.

First, an etching resist is formed on the surface of the silicon substrate 10 on the side thereof in which the cavity CV is formed, using a patterning material, and an opening is formed at a desired position thereof (namely, a resist layer having the opening is formed). The opening of the resist layer is patterned in accordance with the shape of the through hole TH to be formed (e.g., a diameter of about 50 μm). A liquid photoresist (e.g., a liquid resist such as a novolak-base resin or an epoxy-base resin) is used as the patterning material, since this step requires application of a patterning material to a stepped portion (i.e., the cavity CV) as well. A patterning method is the same as the process performed in the step shown in FIG. 3B.

Figure 3C:
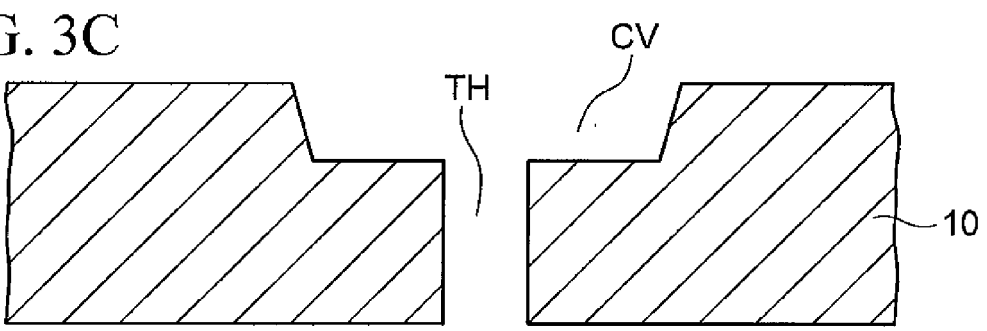

Then, the through hole TH is formed by etching, with the patterned resist layer used as a mask, a portion of the silicon substrate 10 exposed from the opening of the resist layer, by a dry etching process such as RIE, in such a manner that the through hole TH pierces through the silicon substrate 10 in the direction of the thickness thereof. Conditions for the RIE are the same as those for the process performed in the step shown in FIG. 3B. Further, the resist layer used as the etching resist is removed. A removal method is the same as the process performed in the step shown in FIG. 3B. Thereby, fabricated is a structure in which the through hole TH piercing through the silicon substrate 10 in the direction of the thickness thereof is formed in the cavity CV formed in the silicon substrate 10, as shown in FIG. 3C.

In the next step (FIG. 3D), the insulating layer of $SiO_2$ (the silicon oxide film) 11 is formed in a thickness of about 1.5 μm on the surface of the fabricated structure (inclusive of the inner wall surfaces of the cavity CV and the through hole TH), for example, by thermal oxidation method, CVD (chemical vapor deposition) method or the like.

Figure 3D:
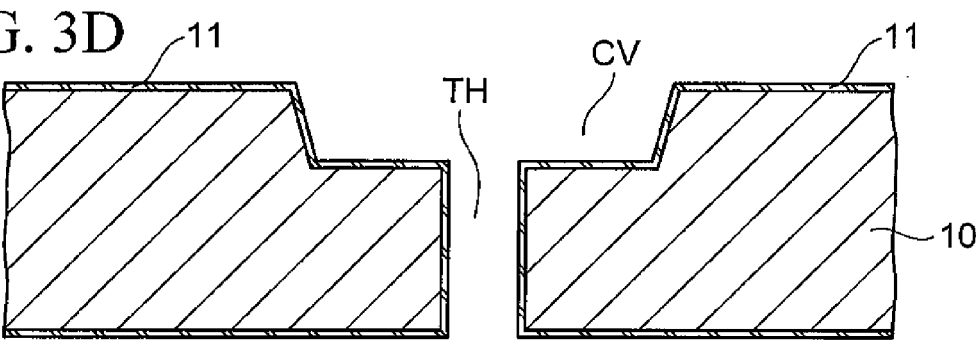

In the next step (FIG. 4A), in the silicon substrate 10 whose surface is coated with the insulating layer 11, the through-hole electrode 12 is formed by filling a conductive material into the through hole TH (FIG. 3D). The through-hole electrode 12 can be formed, for example, in the following manner.

First, a thin copper (Cu) sheet to form a seed layer is laminated via an adhesive onto the surface of the silicon substrate 10 on the side opposite to the side in which the cavity CV is formed (on the lower side thereof in the illustrated example), and then, an adhesive layer exposed at the bottom of the through hole TH is removed by ashing (i.e., dry etching using $O_2$ plasma) so that the seed layer (Cu) is exposed. Then, on the exposed seed layer (Cu), a conductor (Cu) is filled into the through hole TH by electroplating of Cu utilizing the seed layer as a power feed layer.

Figure 4A:
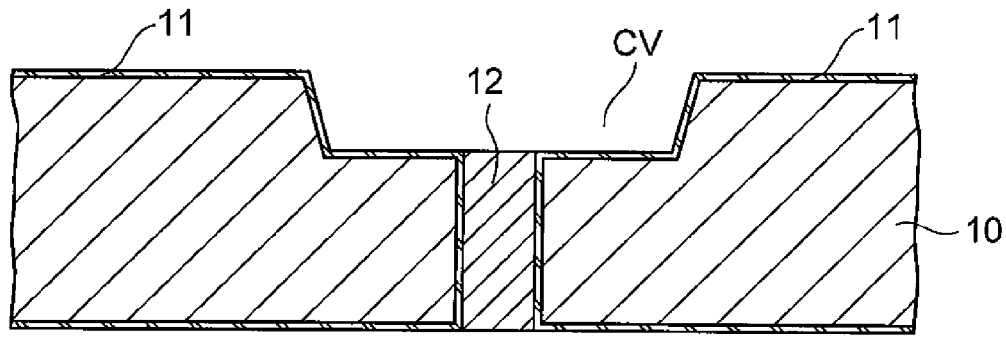
FIGS. 4A to 4C are sectional views showing manufacturing steps following the steps shown in FIGS. 3A to 3D.

After that, the copper (Cu) sheet used as the seed layer is removed by wet etching, and further, the adhesive layer is removed by ashing. Since the through-hole electrode portion slightly projects from the underside of the silicon substrate 10 (or the insulating layer 11), the projecting portion is polished and removed, for example, by chemical mechanical polishing (CMP). Thereby, fabricated is a structure in which a lower end surface of the through-hole electrode 12 is at the same level as the underside of the silicon substrate 10 (or the insulating layer 11), as shown in FIG. 4A.

In the next step (FIG. 4B), the pad portion 22 is formed on the through-hole electrode 12 in the cavity CV in the fabricated structure. The pad portion 22 can be formed, for example, in the following manner.

First, a seed layer of copper (Cu) is formed by sputtering or the like over the entire surface of the silicon substrate 10 on the side thereof in which the cavity CV is formed, and thereafter, a plating resist is formed on the seed layer, using a patterning material, and an opening is formed at a desired position (namely, a resist layer having the opening is formed). The opening of the resist layer is patterned in accordance with the shape of the pad portion 22 to be formed (e.g., a thickness of about 10 μm and a size of about 100 μm). A liquid resist such as a novolak-base resin is used as the patterning material, since this step requires application of a patterning material to a stepped portion (i.e., the cavity CV). A patterning method is the same as the processes performed in the steps shown in FIGS. 3A and 3B.

Then, a conductor layer (Cu) is formed on the seed layer (Cu) exposed from the opening of the resist layer, by electroplating of Cu utilizing the seed layer as a power feed layer. Further, the conductor layer (Cu) is plated with nickel (Ni)

and gold (Au) in this order, so as to form the pad portion 22. After that, the resist layer used as the plating resist is delaminated or etched away, and further, the seed layer is removed by wet etching.

Figure 4B:
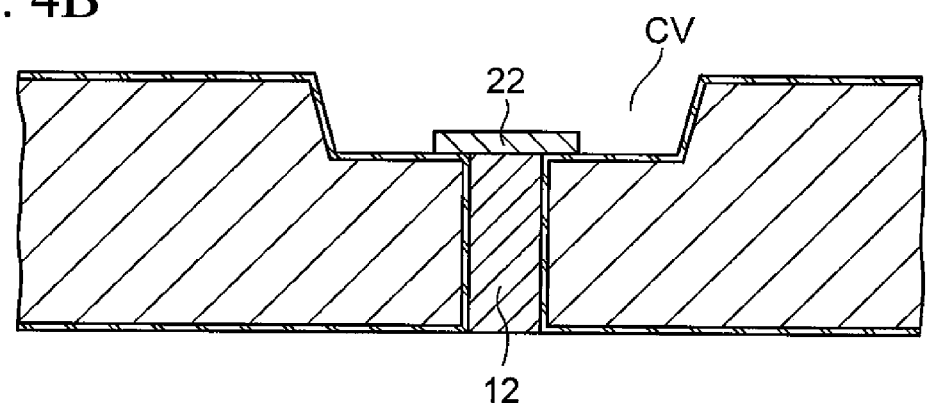
Figure 4C:
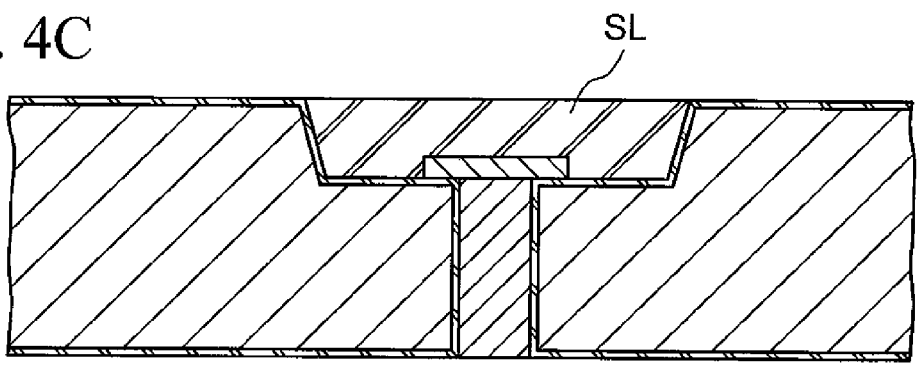

In the next step (FIG. 4C), a sacrificial layer SL is formed to be filled into the cavity CV (FIG. 4B). In the embodiment, a liquid resist such as a novolak-base resin or an epoxy-base resin generally used as the patterning material, is used to form the sacrificial layer SL.

In the next step (FIG. 5A), the lower conductor layer 21a constituting the bimetal is formed on the surface on the side on which the sacrificial layer SL is formed, in such a pattern layout that a portion of the conductor layer 21a (namely, the portion thereof to form the free end of the switch element portion 21) extends along the top surface of the sacrificial layer SL by a predetermined distance The predetermined distance is selected so that the free end of the switch element portion 21 comes into contact with the pad portion 22 when the free end is curved by the bimetal function thereof (FIG. 2A). The conductor layer 21a can be formed, for example, in the following manner.

First, a seed layer having a two-layer structure of, for example, titanium (Ti) and copper (Cu), is formed by sputtering over the entire surface on the side on which the sacrificial layer SL is formed. Then, a plating resist is formed on the seed layer, using a patterning material, and an opening is formed at a desired position (namely, a resist layer having the opening is formed). The opening of the resist layer is formed in accordance with the pattern layout of the conductor layer 21a to be formed. Any one of a dry film and a liquid resist such as a novolak-base resin can be used as the patterning material.

Then, the conductor layer 21a is formed on the seed layer exposed from the opening of the resist layer, by electroplating utilizing the seed layer as a power feed layer. In the embodiment, the seed layer is Cu electroplated to form the conductor layer (or the Cu layer) 21a of about 5 μm thick. The Cu electroplating herein takes place in a plating bath heated to about 50° C. The Cu layer 21a forms the lower conductor layer of the above-mentioned bimetal (the switch element portion 21).

At the next step (FIG. 5B), the conductor layer 21b made of the metal having a lower coefficient of thermal expansion than the metal (Cu) constituting the conductor layer 21a, is formed on the conductor layer (or the Cu layer) 21a formed in the previous step, by electroplating utilizing the above-mentioned seed layer as a power feed layer. In the embodiment, the conductor layer (or the Cu layer) 21a is electroplated with nickel (Ni) so as to form the conductor layer (or the Ni layer) 21b of about 10 μm thick. The Ni electroplating takes place in a plating bath heated to about 50° C., as in the case of the above-mentioned Cu electroplating. The Ni layer 21b constitutes the upper conductor layer of the above-mentioned bimetal (the switch element portion 21). The formation method for the Ni layer 21b is the same as that for the above-mentioned Cu layer 21a.

After that, the plating resist used for the formation of the conductor layers 21a and 21b is delaminated or etched away, and further, the seed layer is removed by wet etching.

In the final step (FIG. 5C), the sacrificial layer SL (FIG. 5B) is removed. In the embodiment, the liquid resist such as the novolak-base resin is used as the material for the sacrificial layer SL as mentioned above, and thus, acetone, alcohol or the like can be used for the removal. The removal of the sacrificial layer SL takes place under normal temperature state (around 23° C.).

Figure 5A:
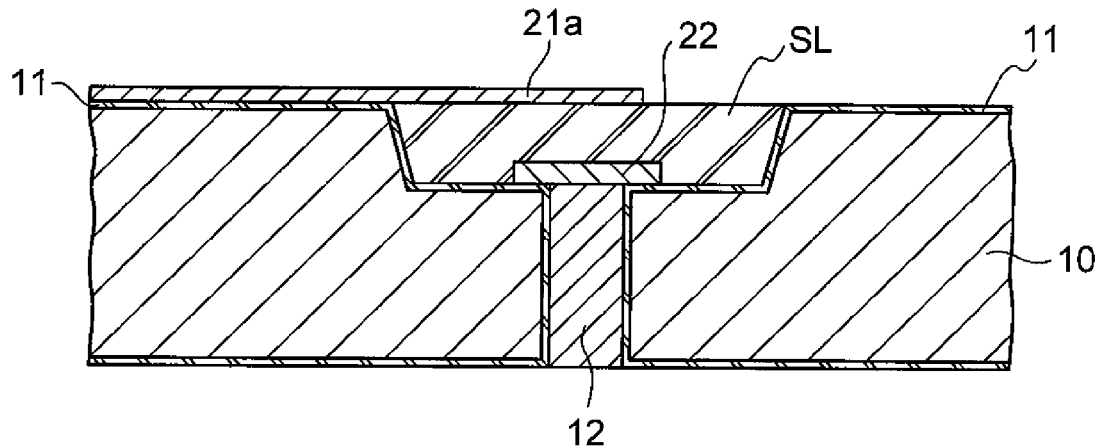
FIGS. 5A to 5C are sectional views showing manufacturing steps following the steps shown in FIGS. 4A to 4C.
Figure 5B:
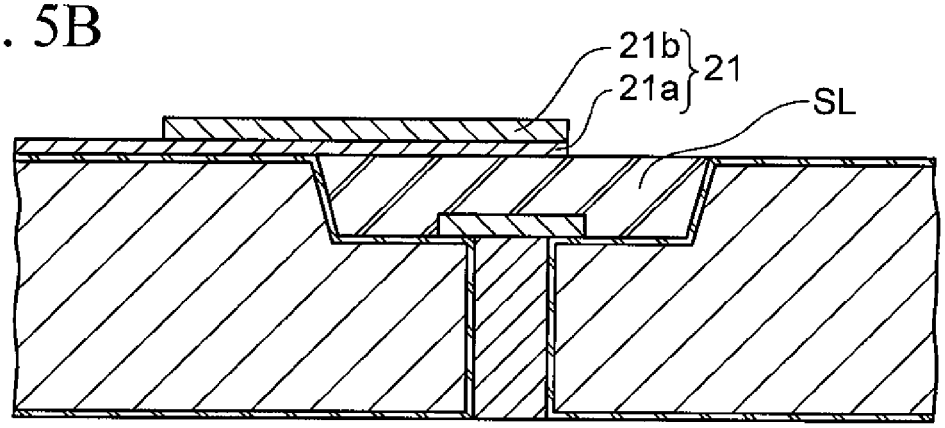
Figure 5C:
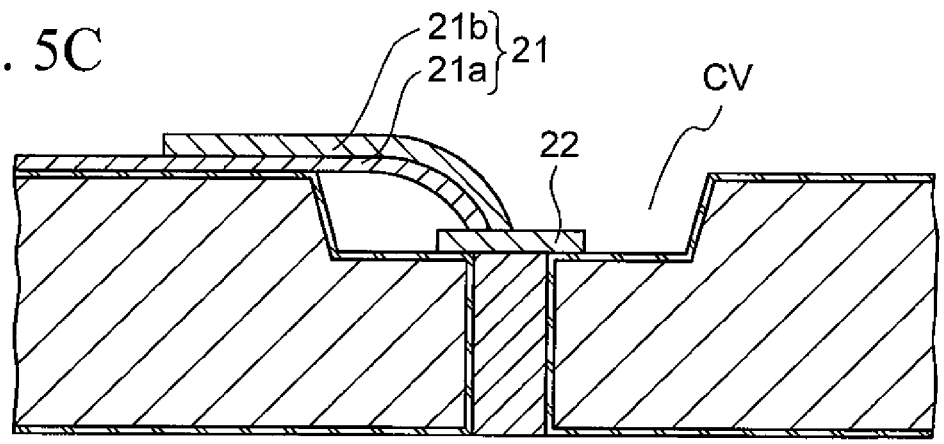

Thereby, the free end of the conductor layers (i.e., the Cu layer 21a and the Ni layer 21b) which form the switch element portion 21 is curved in the cavity CV by the bimetal function and comes into contact with the pad portion 22, as shown in FIG. 5C. Namely, the removal of the sacrificial layer SL results in absence of the member supporting the switch element portion 21, and also, the Cu layer 21a and the Ni layer 21b which have been treated under heated condition at temperature of around 50° C. shrink under normal temperature state (around 23° C.). At the time of shrinkage, the free end of the switch element portion 21 is curved downward in the cavity CV as shown in FIG. 5C, since the metal (Cu) of the lower layer of the bimetal (the switch element portion 21) has a higher coefficient of thermal expansion than the metal (Ni) of the upper layer thereof. In this event, the free end portion of the switch element portion 21, when curved, can reliably come into contact with the pad portion 22, since the free end portion is formed in such a pattern layout as to extend by the predetermined distance as mentioned above.

By the above steps, fabricated is the principal portion (i.e., the switch element portion 21 and its peripheral portion) of the wiring board 30 with switching function according to the embodiment.

As described above, according to the wiring board 30 with switching function (the switch element portion 21 and its peripheral portion) and the method of manufacturing the same according to the embodiment of the present invention, the switch element portion 21 is interposed in the signal transmission line including the wiring layer 13 linked to the given electrode terminal 41 of the chip (MPU) 40 mounted on the wiring board. Thus, even if overheating occurs during the operation of the MPU 40, the free end of the switch element portion 21 moves away from the pad portion 22 by the bimetal function thereof so that the switch element portion 21 is reliably turned off when the temperature exceeds the predetermined temperature (e.g., 200° C.). In other words, the switch element portion 21 serves as a kind of fuse so that the signal transmission line including the wiring layer 13 is automatically disconnected. This in turn allows prevention of occurrence of malfunctioning, thermal runaway or the like, of the MPU 40 which are caused by a temperature increase. This contributes to the extended life of the electronic component.

Moreover, the switching function can be provided in the package (the wiring board 30), and thus, for such an application in which a switching component is provided on the motherboard mounted with the package, the number of external components provided on the motherboard can be reduced. This contributes to miniaturization and cost reduction of the motherboard.

Figure 6:
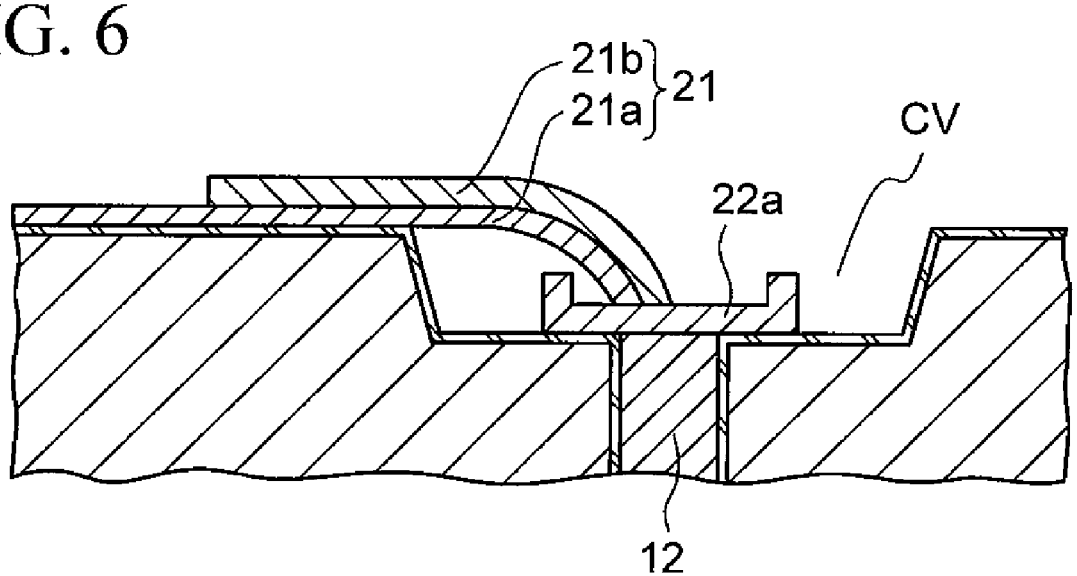
FIG. 6 is a sectional view showing a configuration according to a modified example of the principal part (the switch element portion and its peripheral portion) of the wiring board shown in FIG. 1.

With regard to the above-mentioned embodiment, description has been given by taking the case where the pad portion 22 with which the free end of the switch element portion 21 comes into contact in the cavity CV, is flat in cross-sectional view (see FIGS. 2A and 2B). However, of course, it is to be understood that the configuration of the conductor layer (the pad portion) which constitutes a portion of the signal transmission line is not limited to this, as is apparent from the gist of the present invention. FIG. 6 shows one modified example of the configuration.

In the illustrated example, a pad portion 22a is formed in the shape of a recess (i.e., in such a shape that its periphery projects upward compared to the other portion) in cross-sectional view. Then, the free end of the switch element portion 21 is in contact with the recessed portion of the pad portion 22a (i.e., the portion thereof surrounded by the periphery). The shape of the recess as mentioned above allows engagement of the edge of the pad portion 22a and thus enables maintaining the contact between the free end of the switch element portion 21 and the pad portion 22a, even if the wiring board 30 vibrates horizontally for any reason and the free end of the switch element portion 21 is consequently moved laterally.

Also, with regard to the above-mentioned embodiment, description has been given by taking the case where Cu (the conductor layer 21a) and Ni (the conductor layer 21b) are used as the metals constituting the switch element portion (the bimetal) 21. However, of course, it is to be understood that a combination of the metals constituting the bimetal is not limited to this. Considering the function which the switch element portion 21 should have (namely, the free end thereof is easily curved (or elastically deformed) to come into contact with the pad portion 22 in an environment at or below the predetermined temperature, as shown in FIG. 2A), it is desirable that a material containing metal which improves elasticity should be selected. For example, in the step shown in FIG. 5B, the conductor layer may be plated with an alloy of Ni and cobalt (Co), in place of Ni, so as to form a NiCo plating film. Alternatively, the conductor layer may be plated with chromium (Cr), an alloy of Ni and Cr, or the like. In any of these instances, only a plating solution should be changed, and thus does not cause an increase in the number of steps.

Also, with regard to the above-mentioned embodiment, description has been given by taking the case where the switch element portion 21 is provided on the chip mounting surface side. However, of course, it should be understood that the place for providing the switch element portion 21 is not limited to the chip mounting surface side, as is apparent from the gist of the present invention. For example, the switch element portion 21 may be formed on the surface in the side on which the external connection terminal is bonded (on the lower side in the example shown in FIG. 1), which is opposite to the chip mounting surface. Also in this instance, the switch element portion 21 is likewise sealed with the cap 23, and the surface of the cap 23 is adjusted to be at the same level as the surface of the protection film 18.

Also, with regard to the above-mentioned embodiment, description has been given by taking the case where the silicon substrate 10 is used as the base substrate for the wiring board. However, of course, it is to be understood that the base substrate is not limited to the silicon substrate, as is apparent from the gist of the present invention. For example, a resin substrate used in a plastic package, a ceramic substrate used in a ceramic package, or the like, may be used as appropriate. Note, where the resin substrate is used as the base substrate for the wiring board, it is possible that mounting an LED as the electronic component may cause a deterioration in properties of the resin in the substrate due to ultraviolet light emitted by the LED, depending on the type of LED. It is therefore desirable that the ceramic substrate be used as the base substrate, if such an LED is mounted.

Incidentally, with regard to the above-mentioned embodiment, description has been given by taking the case where the wiring board 30 with switching function is shipped with the semiconductor chip (MPU) 40 mounted thereon as the electronic component. However, of course, it is not necessarily required that the electronic component be mounted on the wiring board. Namely, the wiring board may be shipped with no electronic component mounted thereon, according to customer demand.

What is claimed is:

1. A wiring board with switching function for use in mounting an electronic component, comprising:
   a cavity formed in an electronic component mounting surface side of the wiring board;
   a pad portion formed at a bottom of the cavity; and
   a switch element portion including a first conductor layer and a second conductor layer having different coefficients of thermal expansion, the second conductor layer being in contact with and stacked on the first conductor layer,
   wherein one end of the first conductor layer is electrically connected to an electrode terminal of the electronic component, and the other end of the first conductor layer is in contact with the pad portion, and
   wherein the switch element portion has such a structure as to change the shape thereof depending on a temperature, and to be disconnected from the pad portion when the temperature exceeds a predetermined temperature.

2. The wiring board with switching function according to claim 1, wherein the other end of the first conductor layer is in contact with the pad portion when the temperature is at most the predetermined temperature.

3. The wiring board with switching function according to claim 1, wherein the pad portion is formed in the shape of a recess when viewed in a cross-section, and the other end of the first conductor layer is in contact with a recessed portion of the pad portion when the temperature is at most the predetermined temperature.

4. The wiring board with switching function according to claim 1, wherein at least one of the first conductor layer and the second conductor layer is formed of a film containing metal which improves elasticity.

5. The wiring board with switching function according to claim 1, wherein the first conductor layer is formed of a metal material having a higher coefficient of thermal expansion than that of the second conductor layer.

6. The wiring board with switching function according to claim 1, further comprising a cap provided to seal the cavity and the switch element portion, and a protection film formed to cover the first conductor layer, wherein a height of the cap is on a level with a surface of the protection film when the switch element portion is sealed.

* * * * *